United States Patent [19]
Pierce

[11] Patent Number: 5,431,974
[45] Date of Patent: Jul. 11, 1995

[54] ELECTROMAGNETIC RADIATION SHIELDING FILTER ASSEMBLY

[76] Inventor: Patricia Pierce, R.D. #2, Box 189, Landenberg, Pa. 19350

[21] Appl. No.: 168,626

[22] Filed: Dec. 16, 1993

[51] Int. Cl.⁶ ............................................. B32B 9/00
[52] U.S. Cl. ................................... 428/45; 428/304.4; 428/311.1; 428/292; 55/385.4; 55/385.6; 55/471; 55/493; 55/508
[58] Field of Search ............... 428/45, 292, 304.4, 428/311.1

[56] References Cited

U.S. PATENT DOCUMENTS 4,863,499  9/1989  Osendorf ....................... 55/316
4,889,542  12/1989  Hayes ............................. 55/97

OTHER PUBLICATIONS

Chomeric Catalog Pages (6)—Appendix A.
Tecknit Catalog Pages (4)—Appendix B.
Instrument Specialties Catalog Pages (3)—Appendix C.
Spira Catalog Pages (2)—Appendix D.
Tech. Etch Catalog Pages (3)—Appendix E.

*Primary Examiner*—Patrick J. Ryan
*Assistant Examiner*—Kam F. Lee

[57] ABSTRACT

A compact and lightweight filter assembly for mounting on electronic equipment enclosures which provides EMI shielding and passage of air to the enclosure.

4 Claims, 2 Drawing Sheets

ELECTROMAGNETIC RADIATION SHIELDING FILTER ASSEMBLY

FIELD OF THE INVENTION

This invention relates to electromagnetic radiation shielding materials, more particularly, to an electromagnetic-radiation-shielding air filter assembly for mounting on equipment enclosures.

BACKGROUND OF THE INVENTION

Many shielded electronic equipment enclosures and housings provide internal ventilation, temperature control and ambient pressure equilibration by air circulation through them. Air passage into and out of the enclosures is through electromagnetic-radiation-shielding devices and air filters located in the enclosure vents. It is expected of these shielding devices and filters that they prevent, or reduce to acceptable levels, passage of electromagnetic radiation or interference (EMI); and that they also prevent passage of particulate materials to specified size levels, while minimizing impediments to flow of air through the enclosure.

Many devices and assemblies that provide effective EMI shielding are known in the art and are commercially available. Likewise, air filtration devices and assemblies are well known and available commercially. There are also commercially available devices and assemblies in which the functions of EMI shielding and air filtration are combined in a single unit. For the most part, however, these devices and assemblies suffer deficiencies in size, weight, and cost that are desirable to be overcome.

For example, metal honeycomb assemblies are very effective in shielding against EMI, however, they are quite bulky, ranging in thickness from about ½" to several inches depending on the electromagnetic radiation frequency range over which they are providing shielding. Furthermore, the honeycomb assemblies are usually arrays of open tubes that provide no barrier properties to passage of dust, dirt, or other particles through them and, consequently, require that separate filtration units be included in the equipment if prevention of passage of particles into the enclosure is important. This adds to the bulk, cost, and complexity of the system.

Devices and assemblies which combine EMI shielding and filtration functions generally consist of layers of metal wire screen or mesh fixed in mounting frames. The mounting frames are usually metal extrusions having complex shapes to which the metal wire screen or mesh are joined by crimping or other mechanical means, or by joining methods such as soldering or welding. These, too, are quite bulky and, due to their complexity, difficult and expensive to manufacture and install.

In general then, for installations in which there is great flexibility in space and weight considerations, effective EMI-shielding filter assemblies can be constructed from methods and materials well known in the art.

On the other hand, for installations in small, portable electronic devices such as hand-held nuclear radiation detectors, hip-mounted air samplers, and other electronic sensors and instruments or, in mobile electronic systems such as radio/telephone communication systems, missile guidance and control systems, and the like, in which there are severe constraints on the size and weight of components, there is a need for compact, lightweight, effective EMI-shielding air-filtration devices and assemblies capable of operating in a broad range of environments.

SUMMARY OF THE INVENTION

This invention provides a compact, lightweight filter assembly for mounting on electronic equipment enclosures which provides effective EMI shielding and air filtration to the enclosure. The assembly is simple in design, and is easily constructed and installed.

The filter assembly comprises
(a) an electrically-conductive frame having at least one opening therethrough for air passage;
(b) a panel of porous electrically-conductive material having a size and shape smaller than the outer dimensions of the frame;
(c) a layer of electrically-conductive adhesive; and
(d) an electrically-conductive gasket material having opening dimensions approximately the same as the frame so as to not obstruct air passage, and outer dimensions greater than the outer dimensions of the porous electrically-conductive panel;

wherein the electrically-conductive adhesive layer is affixed to the surface of the electrically-conductive gasket so as to adhere, and electrically connect, the electrically-conductive gasket material to the electrically-conductive porous panel in a position such that the outer edge of the electrically-conductive panel is approximately equidistant from the outer edge of the electrically-conductive gasket; the electrically-conductive gasket and attached electrically-conductive porous panel are adhered to the inside surface of the electrically-conductive frame by the electrically-conductive adhesive, thereby forming a filter assembly having all components electrically connected so as to provide electromagnetic radiation shielding.

The filter assembly can be attached, and electrically connected, to an equipment enclosure or other surface by conventional means, including screws, bolts, clamps, and the like.

Another embodiment of the invention further comprises a second layer of electrically-conductive adhesive added to the assembly described above which is applied to the surface of the electrically-conductive gasket facing away from the frame, whereby the electromagnetic radiation shielding assembly can be attached to an equipment enclosure or other surface by adhesive means.

DETAILED DESCRIPTION OF THE INVENTION

With reference to the drawings, the invention and its construction will be described in detail.

Figure 1:
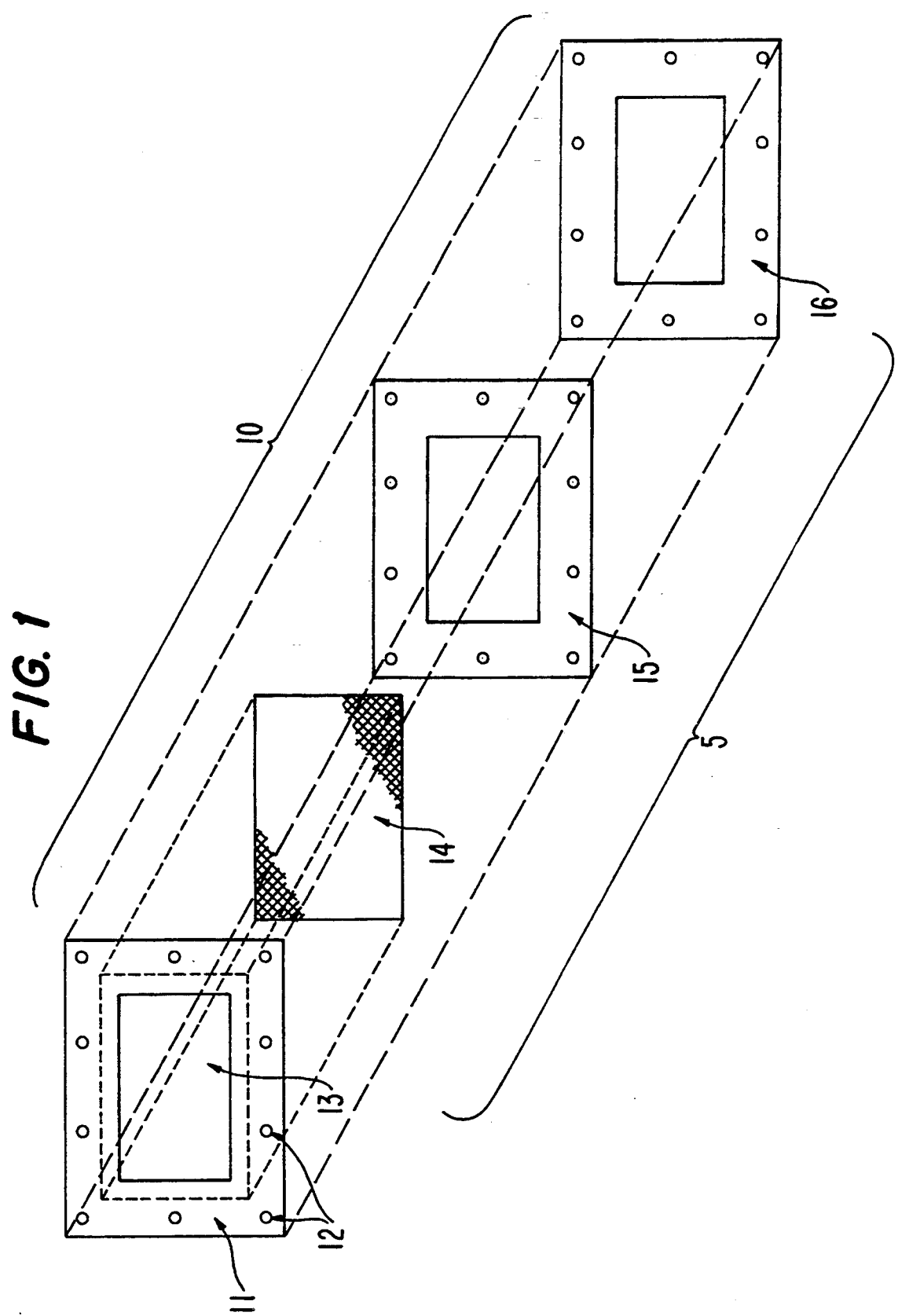
FIG. 1 is an exploded view of an embodiment of the invention.

Referring to FIG. 1, the components of the EMI-shielding filter assembly 10 are shown in exploded view.

When assembled, the components form a layered article having contiguous electrically-connected layers comprising a porous panel 14 of electrically-conductive material sandwiched between a frame 11 and a gasket 16; all of which are bonded together by a layer of adhesive 15. The components are considered to be essentially flat or planar in nature, i.e., their length and width are much greater than their thickness; and dimensions referred to herein are those in the planar length-width directions.

The frame 11 is formed of an electrically-conductive material, preferably a metal, by conventional means such as machining, stamping, and the like to define at least one opening 13 for passage of air. For simplicity, the figures and description herein illustrate the assembly of the invention having a single opening for air passage. However, for large filter assemblies, frames defining more than one opening for air passage can be used, are equally as effective, and are included in the invention. The frame may also, optionally, have holes 12 for screws, bolts, and the like, to facilitate attachment of the assembly to a surface. A preferred material for the frame is aluminum, although other electrically-conductive materials, for example, stainless steel, nickel, metallized plastic, etc., can be used for applications in harsh environments.

The porous panel 14 may be any porous material having sufficient electrical conductivity and having a structure such that incident electromagnetic radiation presented to it will be substantially reflected, intercepted, or otherwise attenuated. Such electrically conductive materials include woven wire mesh, sintered porous metals, metal wool or sponge, etc.. The materials most preferred for the porous electrically-conductive panel 14 are porous non-woven sheet, film, or mesh of synthetic polymers. Such porous non-woven sheet, film, or mesh may be prepared from the classes of polymers including, but not limited to, polyamides, polyesters, polyolefins, polyurethanes, fluoropolymers, and the like, by fiber processes known in the art such as spin bonding, felting, paper-making, and the like, or by other pore-forming processes known in the art, for example, foaming, stretching, or expansion processes. The non-woven sheet, film, or mesh are made electrically conductive by application of metals to their surfaces by metallizing processes such as electroless chemical deposition, electrochemical deposition, vapor deposition, sputter coating, and the like. These materials may also be combined in laminated constructions to form the porous panels. Selection of materials for the porous panels will vary depending on the filtration, air flow, and electromagnetic radiation attenuation requirements of an end-use application.

Figure 2:
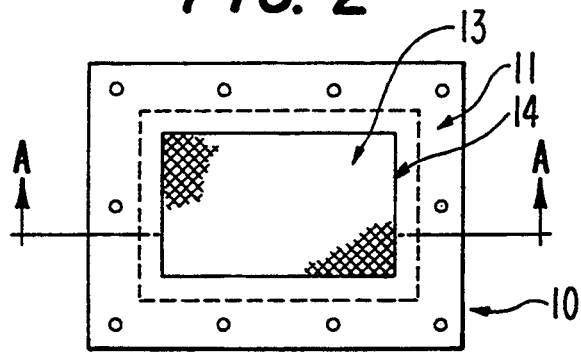
FIG. 2 is a front view of the outside surface of the embodiment of the invention of FIG. 1.

The electrically-conductive porous panel 14 has a size and shape sufficient to fully cover the at least one air passage opening 13 in the frame 11, but has outer dimensions smaller than the outer dimensions of the frame 11, as shown in FIG. 2. FIG. 2 is a view showing the front, or outside surface, of the filter assembly.

Figure 3:
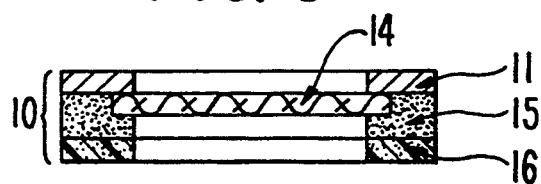
FIG. 3 is a cross-section view taken through A—A' of FIG. 2.

Referring now to FIGS. 1 and 3, the electrically-conductive panel 14 is positioned on the electrically-conductive adhesive layer 15 adhered to the surface of electrically-conductive gasket 16, so that the adhesive contacts and adheres to the inside surface of the panel 14, thus forming a sub-assembly 5. The adhesive layer 15 extends outwardly beyond the edge of the panel 14 so that it can be used to adhere, and electrically connect, the sub-assembly 5 to the frame 11, to complete the filter assembly 10. The sub-assembly 5 is positioned on the frame 11 so that the air-passage opening 13 is fully covered by the porous electrically-conductive panel 14. By application of a compressive force to the assembly 10 the porous electrically-conductive panel 14 is pinned against the inside surface of the frame 14 and the gasket layer 16 and adhesive layer 15 deform to seal around the edges of the electrically-conductive panel 14 and to adhere the sub-assembly 5 to the frame 11.

The electrically-conductive adhesive can be selected from many known in the art. Suitable adhesives may be found in, but not limited to, the classes of thermoplastic, thermosetting, or reaction curing polymers to which electrically-conductive particles have been added as fillers to make them electrically-conductive. Suitable electrically-conductive filler particles include metal particles such as silver, gold, nickel, stainless steel, and the like, or, preferably, high conductivity carbon particles. The electrically-conductive adhesive may be applied to the desired surface by conventional means, for example, by printing or coating methods, or as a preformed sheet or web. The electrically-conductive adhesive can be applied to form a non-porous layer, for example, as a continuous coating or as a preformed non-porous sheet. The electrically-conductive adhesive can also be applied to form a continuous porous layer, for example, as a preformed non-woven web or mesh, or as a non-continuous coating such as a printed dot pattern. Preferably, the electrically-conductive adhesive layer 15 is a pressure-sensitive adhesive polymer film containing electrically conductive carbon particles, and having an electrical volume-resistivity of 10 ohm-cm or less. Such pressure-sensitive electrically-conductive adhesives are known in the art and are commercially available. For example, Conductive Acrylic Transfer Adhesive made by Adhesives Research Corp., is a pressure-sensitive acrylic-resin-based adhesive containing electrically-conductive carbon particles and has electrical resistivity of 10 ohm-cm or less.

Figure 4:
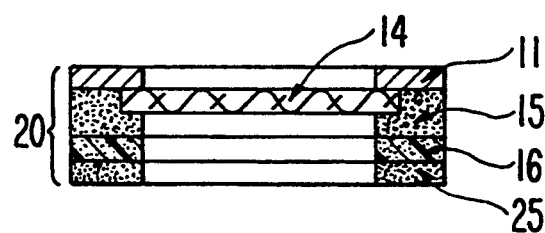
FIG. 4 is a cross-section of another embodiment of the invention.

Another embodiment of the invention is shown in FIG. 4. In this embodiment a second layer of adhesive is added to the filter assembly 10 described above. The second layer of adhesive 25 is adhered to the surface of the gasket 16 facing away from the frame 11 to form the filter assembly 20. This enables the filter assembly 20 to be mounted on and electrically connected to an equipment enclosure or other surface without the use of mechanical fasteners or clamps. The adhesive layer 25 can be selected from the materials described above, but is not necessarily the same material used in the first adhesive layer 15. For example, a relatively soft, pliable adhesive may be used for the electrically-conductive adhesive layer 15, and a harder, stronger, and less pliable electrically-conductive adhesive used to form the adhesive layer 25.

The electrically-conductive gasket 16 can be made of any material having suitable electrical conductivity, sealability, and chemical resistance. Commercially available electrically-conductive gasket materials which are suitable include silicone rubbers filled with electrically-conductive particles, silicone rubbers filled with metal wire, expanded-graphite, and the like. A preferred material for the electrically-conductive gasket 16 is expanded polytetrafluoroethylene filled with electrically-conductive particles, such as GORE-SHIELD ® electrically-conductive gasketing (sold by W. L. Gore and Associates, Elkton, Md.).

Figure 5:
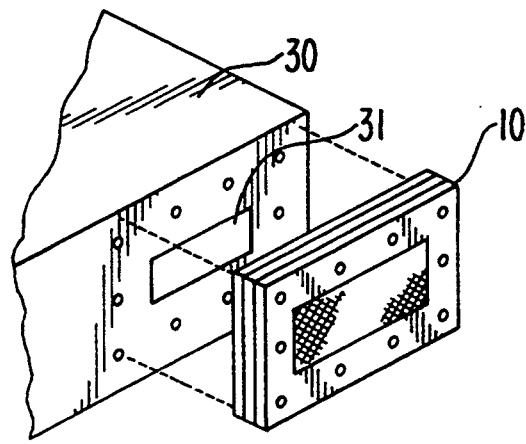
FIG. 5 illustrates an application of an embodiment of the invention.

In FIG. 5 is shown an assembly 10 of the invention having bolt holes, preparatory to being clamped in place on an equipment enclosure 30. The bolt holes of the assembly 10 are aligned with matching bolt holes 31 on the equipment enclosure 30. Bolts or screws (not shown) will be inserted in the holes to clamp the assembly to the enclosure with sufficient force to compress the gasket and form a seal between the assembly 10 and the enclosure 30.

EXAMPLE 1

A porous vent material consisting of a 2.0 inch (5.08 cm) diameter disc of electrically-conductive polyester mesh (Flectron ® electrically-conductive metallized polyester mesh, having a layer of nickel metal over a layer of copper metal, made by Monsanto Corp.) was cut and placed, approximately centered, on a flat washer-shaped frame of aluminum. The aluminum frame has an outside diameter of 2.5 inches (6.35 cm), an inside diameter of 1.5 inches (3.8 cm), and a thickness of 0.032 inch (0.08 cm).

A flat washer-shaped disc of electrically-conductive gasketing material having the same inside and outside diameter dimensions as the aluminum frame was prepared from GORE-SHIELD ® GS-2100 electrically-conductive self-adhesive gasket material (GORE-SHIELD ® GS-2100 electrically-conductive self-adhesive gasket material is a carbon-filled porous expanded polytetrafluoroethylene sheet with a layer of Conductive Acrylic Transfer Adhesive (volume resistivity 10 ohm-cm), made by Adhesives Research Corp., on its surface. The GORE-SHIELD ® GS-2100 is made by W.L. Gore and Associates, Elkton, Md.

The washer-shaped gasket disc was placed over the porous vent material and centered on the aluminum frame so that the adhesive contacts the porous vent material and aluminum frame, thus fixing in place and electrically connecting the porous vent material and gasket material to the frame to form the EMI-shielding filter assembly of the invention.

The EMI-shielding filter assembly was bolted to a 1/16 inch (0.16 cm) thick aluminum panel to simulate attachment to an electronic equipment enclosure and the electrical conductivity of the EMI-shielding assembly was measured using a modified Military Specification Test, Mil-G-83528, as follows:

The bolted assembly was placed in an electrical-conductivity test apparatus having 1.0 inch (2.54 cm) diameter opposed test surfaces connected to an instrument for measuring electrical conductivity. The test surfaces are brought into opposing contact against the outer surfaces of the aluminum frame and aluminum panel and apply a force of 25 psi (1.8 kg/cm$^2$) to the surfaces. The electrical resistance from the aluminum frame to the aluminum panel was determined to be 40 ohms.

I claim:

1. A filter assembly comprising:
   (a) an electrically-conductive frame having an inside surface and an outside surface, and constructed to define at least one opening therethrough for air passage;
   (b) a porous panel of electrically-conductive material having an inside surface and an outside surface, and having a size and shape smaller than the outer dimensions of said frame but sufficiently large to fully cover said air-passage opening;
   (c) a layer of electrically-conductive adhesive; and
   (d) an electrically-conductive gasket material having an inside surface and an outside surface, and having opening dimensions approximately the same as said frame air-passage opening so as to not obstruct air-passage, and outer dimensions greater than the outer dimensions of said porous electrically-conductive panel;

wherein said electrically-conductive adhesive is affixed to the surface of said electrically-conductive gasket material so as to adhere, and electrically connect, said electrically-conductive gasket material to said porous electrically-conductive panel in a position such that the outer edge of said electrically-conductive panel is approximately equidistant from the outer edge of said electrically-conductive gasket material; said electrically-conductive gasket material adhered to the inside surface of said electrically-conductive frame by said electrically-conductive adhesive; thereby forming a filter assembly having all components electrically connected so as to provide electromagnetic radiation shielding.

2. The filter assembly as recited in claim 1 further comprising a layer of electrically-conductive adhesive adhered to the surface of the electrically-conductive gasket facing away from the frame.

3. The filter assembly as recited in claim 1 or claim 2, wherein the porous panel of electrically-conductive material is a metallized porous non-woven sheet of synthetic polymers.

4. The filter assembly as recited in claim 1 or claim 2, wherein the electrically-conductive gasket material is carbon-filled expanded polytetrafluoroethylene.

* * * * *